United States Patent [19]

Bartschat et al.

[11] Patent Number: 4,980,971
[45] Date of Patent: Jan. 1, 1991

[54] METHOD AND APPARATUS FOR CHIP PLACEMENT

[75] Inventors: Michael K. Bartschat, Boston, Mass.; Joseph S. Kovalchick, Germansville, Pa.

[73] Assignee: AT&T Bell Laboratories, Murray Hill, N.J.

[21] Appl. No.: 456,930

[22] Filed: Dec. 14, 1989

[51] Int. Cl.⁵ .......................... H05K 3/30; B23P 19/00
[52] U.S. Cl. ......................................... 29/833; 29/740; 29/759; 29/720; 414/730; 901/40; 901/47
[58] Field of Search ................. 29/832, 833, 834, 840, 29/859, 740, 741, 759, 720; 414/730; 901/40, 46, 47

[56] References Cited

U.S. PATENT DOCUMENTS

| | | | |
|---|---|---|---|
| 3,808,063 | 2/1986 | Haley | 414/730 |
| 4,598,456 | 7/1986 | McConnell | 29/833 X |
| 4,628,964 | 12/1986 | McConnell | 29/759 X |
| 4,639,878 | 1/1987 | Day et al. | 364/513 |
| 4,654,949 | 4/1987 | Pryor | 29/407 |
| 4,668,895 | 5/1987 | Schneiter | 315/158 |
| 4,675,993 | 6/1987 | Harada | 29/759 X |
| 4,705,081 | 11/1987 | Birk et al. | 29/741 X |
| 4,731,860 | 3/1988 | Wahl | 382/41 |
| 4,738,025 | 4/1988 | Arnold | 29/833 X |
| 4,754,415 | 6/1988 | George et al. | 364/513 |
| 4,755,053 | 7/1988 | Levinson et al. | 356/400 |
| 4,772,128 | 9/1988 | Vinarub et al. | 356/384 |
| 4,782,273 | 11/1988 | Moynagh | 29/833 X |
| 4,788,440 | 11/1988 | Pryor | 250/561 |
| 4,791,482 | 12/1988 | Barry et al. | 358/107 |
| 4,795,913 | 1/1989 | Blessing et al. | 250/561 |
| 4,796,200 | 1/1989 | Pryor | 364/513 |
| 4,808,064 | 2/1989 | Bartholet | 414/730 |

OTHER PUBLICATIONS

K. Kearney, "Assembly Automation Accommodates Advanced VLSI Packaging", Semiconductor International, Nov. 1988, p. 38.
M. K, Bartschat, "An Automated Flip-Chip Assembly Technology for Advanced VLSI Packaging," Conference Proceedings, 38th Electronics Components Conference, Los Angeles, Calif., May, 1988, pp. 335-341.
F. J. M. van der Heijden, "Assembly of Small Components by a Vision-Controlled Robot Using the Philips Vision System PAPS," Proceedings of the Fifth International Conference on Robot Vision and Sensory Controls, Oct. 29, 31, 1985, IFS Ltd., Kempston, England, pp. 517-528.
A.-R. Mansouri and A. Malowany, "Using Vision Feedback in Printed-Circuit Board Assembly," 1985 IEEE Microprocessor Forum: Design Productivity through Engineering Workstations, Apr. 2-4, 1985, IEEE, New York, N.Y., pp. 115-122.

Primary Examiner—Carl E. Hall
Assistant Examiner—Carl J. Arbes
Attorney, Agent, or Firm—Robert B. Levy

[57] ABSTRACT

A system (10) for precisely placing a semiconductor chip (16) on a substrate (11) includes a robotic arm (18) which is provided with a gripper (22) for separately picking up the chip and substrate. A first television camera (38) is carried by the robotic arm and serves to capture the image of the substrate to locate a pair of datum points (71a and 71b) thereon. A second camera (40), stationary with respect to the robotic arm, serves to capture the image of the chip (16), when engaged by the robot, to locate each of a pair of datum points (83a and 83b) thereon. A machine vision system (46) serves to process the output signal of the cameras (38) and (40) to establish the precise location of the datum points on the substrate and on the chip. The information from the vision system (46) is employed to control the robotic arm to cause the gripper to place the chip on the substrate such that each of the datum points on the substrate is at a prescribed location relative to a separate one of the datum points on the chip.

12 Claims, 9 Drawing Sheets

METHOD AND APPARATUS FOR CHIP PLACEMENT

TECHNICAL FIELD

This invention relates generally to a method and apparatus for accurately placing a semiconductor chip on a substrate.

BACKGROUND ART

Present day technology permits a large number of discrete electrical components (transistors, diodes, etc.) to be integrated on a single semiconductor chip that may be packaged to create an integrated circuit adapted for attachment to a circuit board. Extremely sophisticated electronic systems can be fabricated on a single circuit board by placing various integrated circuits thereon. There is now an effort to increase the level of performance of such systems by fabricating them from individual semiconductor chips, each placed on a silicon substrate which serves to connect the chips. Each chip is attached by a set of solder bumps on its bottom surface to a matching set of solder bumps on the substrate. The inductance of the joints between the chips and the substrate is much lower, as compared to the inductance which exists between a conventional integrated circuit and a circuit board, thus allowing for higher operating frequencies.

One difficutly that has limited the extent to which electronic systems may be fabricated from semiconductor chips placed on a silicon substrate is the high degree of accuracy required to place the chips. The typical diameter of each solder bump on the major surface of the substrate is on the order of 100 microns. The center-to-center spacing between solder bumps is generally on the order of 200 microns. In order to prevent short circuits, no more than a 25-micron placement tolerance between each solder bump on the substrate and each corresponding solder bump on the chip is permitted. Conventional placement equipment cannot generally achieve a placement tolerance of less than 50 microns.

Thus, there is need for a technique for placing a semiconductor chip on a substrate with a high degree of accuracy.

BRIEF SUMMARY OF THE INVENTION

Briefly, in accordance with the invention, a method is disclosed for placing an article (i.e., a semiconductor chip) on a object (i.e., a silicon substrate) using a movable gripper (a robot) and a pair of television cameras, one mounted to the gripper, the other being stationary. The first step in the process is to calibrate each of the two cameras so that a reference point within the field of view of each camera is located in the frame of reference of the gripper. The reference point in the field of view of each camera will hereinafter be referred to as a "reference pixel," although in actuality, its size is smaller than each of a plurality of picture elements (pixels) in the image captured by each camera. After the two cameras have been calibrated, the cameras are then employed to precisely locate the article and the object so that extremely accurate placement can be achieved. In order to place the article exactly on the object, the object is first located in the frame of reference of the gripper. This is accomplished by displacing the gripper to locate the first camera such that its reference pixel is successively aligned with each of a pair of datum points on the object. From a knowledge of the position of the gripper at which the reference pixel of the first camera is in alignment with a successive one of the two datum points, the object can be precisely located. Once the object is located, the article is located by first engaging the article with the gripper and then displacing the article to successively located each of a pair of datum points on the article in registration with the reference pixel of the second camera. From a knowledge of the location of the gripper at which each datum point on the article is in registration with the reference pixel of the second camera, the location of the article in the frame of the gripper can be established. Once the article and the object have been precisely located, the article can be precisely placed on the object.

DETAILED DESCRIPTION

Figure 1:
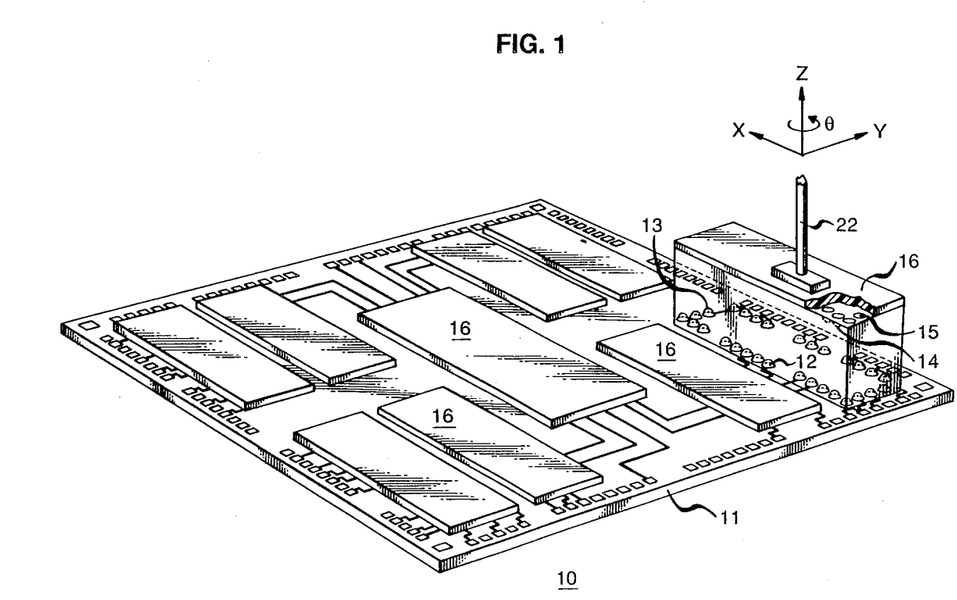
FIG. 1 is a perspective view of an electronic assembly comprised of a substrate having a plurality of semiconductor chips bonded to its major surface.

FIG. 1 illustrates a prior art electronic assembly 10 comprised of a substrate 11 (e.g., silicon) having a plurality of metallized pads 12 on its upper major surfaces, each pad having an upwardly rising solder bump 13 bonded to it. The pads 12, and hence, the solder bumps 13, are arranged in patterns, each pattern corresponding to a pattern of solder bumps 14, each bonded to a metallized contact 15 on the undersurface of a semiconductor chip 16. Each chip 16 is secured to the substrate 11 by first placing the chip so that each of its solder bumps 14 is in contiguous alignment with a corresponding one of the solder bumps 13 on the substrate. Thereafter, the solder bumps 14 on the chip 16 are "tacked," that is, partially bonded by thermocompression, to the bumps 13 on the substrate 11. After the tacking operation, both the chips 16 and the substrate 11 are heated to reflow the solder bumps 13 and 14 to establish a reliable electrical connection between each pad 12 and each contact 15.

The process of placing each chip 16 on the substrate 11 must be carried out at high accuracy because of the small size of, and close spacing between, the solder bumps 13 on the substrate 11. In practice, the solder bumps 13 are usually no more than 100 microns in diameter and are spaced on the order of 200 microns apart.

To assure reliable operation of the electronic assembly 10, the placement tolerance must be on the order of 25 microns or less. Otherwise, undersirable electrical short circuits may occur.

Figure 2:
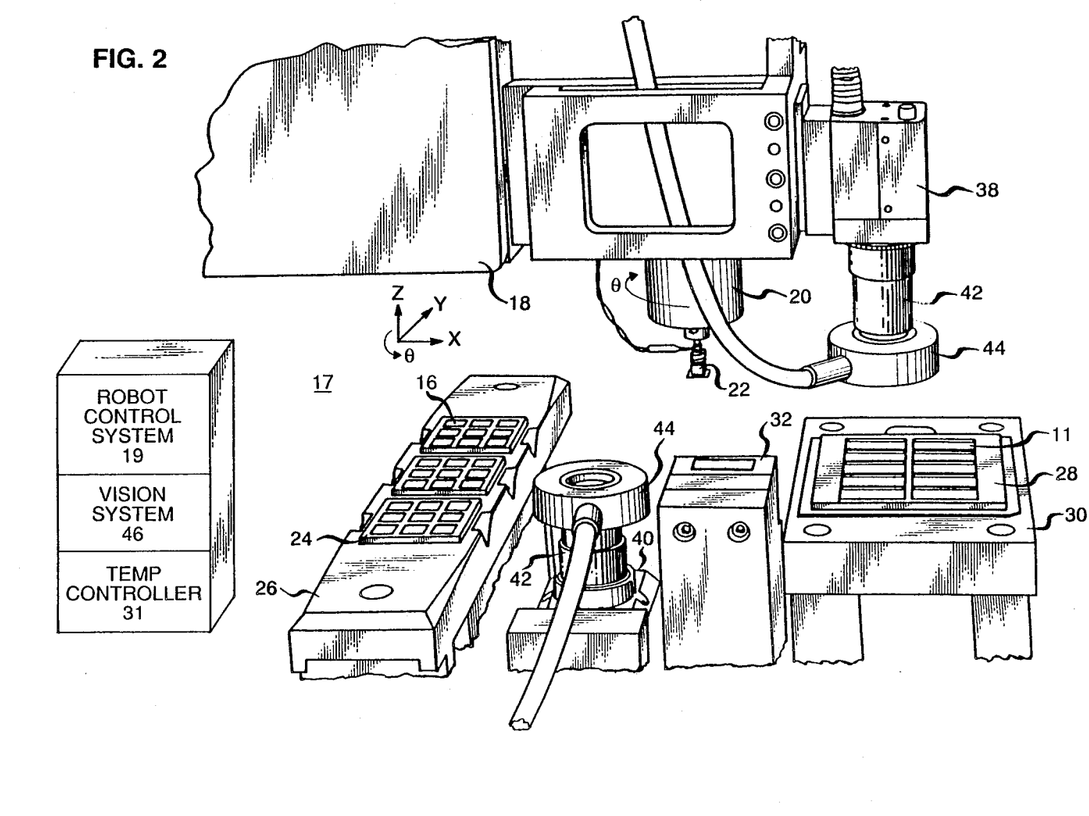
FIG. 2 is a perspective view of a system for precisely placing the chips of FIG. 1 on the substrate of FIG. 1.

Referring now to FIG. 2, there is shown a system 17, in accordance with the present invention, for accurately placing the chips 16 on the substrate 11 and then tacking them thereto. The system 17 comprises a robotic arm 18 which is movable in the x,y,z and $\theta$ directions under the command of a control system 19. In the illustrated embodiment, the robotic arm 18 and the control system 19 collectively comprise a Seiko-Epson model XY 3000 Cartesian robot. At the end of the robotic arm 18 is an end effector 20 (gripping mechanism) from which depends a vacuum pickup tool 22 which is rotated by a motor (not shown) in the arm about an axis $\theta$ (see FIG. 1). The vacuum pickup tool 22 serves to engage a separate one of the chips 16 and the substrates 11. The chips 16 are typically stored in separate compartments in a waffle holder 24, supported by a table 26, while the substrates 11 are each stored in separate compartments in a waffle pack 28 seated on a table 30 spaced a short distance from the table 26. Within the pickup tool 22 is a heater (not shown) which is thermostatically controlled by a temperature controller 31 for precisely heating a chip 16 picked up by the tool.

As will be described in greater detail, the system 17 is operated such that the vacuum pickup tool 22 first picks up one of the substrates 11 stored in the waffle holder 28 and then places the substrate in a heated substrate chuck 32. The chuck 32 is heated by a heater (not shown), whose temperature is controlled by the temperature controller 31 to maintain the substrate 11 at an equilibrium temperature. The chip 16 is then picked up and placed on the substrate 11 for tacking thereto. After each of the chips 16 has been tacked to the substrate 11, the entire assembly 10 is then placed in an oven (not shown) to reflow the solder bumps 13 (see FIG. 1) on the substrate, and the solder bumps 14 (see FIG. 1) on the chips, to bond each to the other.

As discussed, placement of each chip 16 on the substrate 11 must be carried out with a high degree of precision because of the small size and spacing of the solder bumps 13 on the substrate. To aid in placement of the chips 16 on the substrate 11, the system 17 includes a pair of television cameras 38 and 40, each provided with a lens 42, and a ring light 44 which is carried by the lens for illuminating the camera's field of view. The camera 38 is attached to the robot arm 18 parallel to its z axis for movement along the arm's x and y axes. The camera 38 does not, however, rotate about the $\theta$ axis. The camera 38 is trained downward to observe the image of the upper surface of the particular substrate 11 placed in the chuck 32. The camera 40, which is located between the table 26 and the substrate chuck 32, is stationary and is trained upwardly, to observe the bottom of the chip 16 engaged by the vacuum tool 22. Each of the television cameras 38 and 40 is coupled to a machine vision system 46, which is housed together with the robot control system 19 and the temperature controller 31 in an enclosure (not shown). The vision system 46 typically comprises a model AV-5 vision system made by Automatix Corporation, which, in addition to serving as the host for the temperature controller 31, also serves to process the output signal of each of the cameras 38 and 40 to detect the presence and position of certain attributes within the image captured by each camera. Further, the vision system 46 also acts to send instructions to the robot control system 19, which, in turn, moves the robotic arm 18 accordingly.

Figure 3:
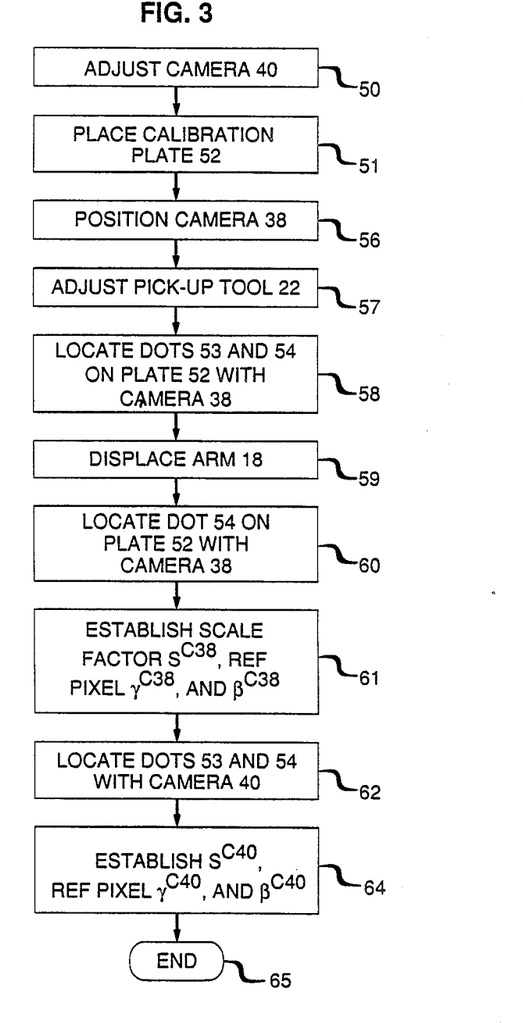
FIG. 3 is a flow chart diagram of a process for calibrating the system of FIG. 2.

To achieve precise placement of each chip 16 on the substrate 11 in accordance with position data from the vision system 46 of FIG. 1, it is necessary to calibrate the system 10 so that features on both the chip and the substrate can be precisely located in the frame of reference of the robot 18. Referring now to FIG. 3, there is shown a flowchart representation of a calibration technique, in accordance with the invention, for calibrating the system 10. The first step (step 50) in the calibration process of FIG. 3 is to adjust the z axis position of the camera 40 of FIG. 2 so that the camera has its focal plane (i.e., the plane in front of its lens 42 on which the image is focused) coplanar with the "tacking plane." The tacking plane is the plane within which the tips of solder bumps 14 on the chip 16 are tacked (partially thermocompressively bonded) to the tips of the solder bumps 13 on the substrate 11, all of FIG. 1. (During initial setup of the robotic arm 18, the arm is adjusted so that it travels in x and y in a plane parallel to the tacking plane.) Following step 50, step 51 of FIG. 3 is executed and a calibration plate 52 (see FIG. 4), comprised of a glass slide having a pair of spaced dots 53 and 54 thereon, is placed at the focal plane of the camera 40 of FIG. 1 so that each dot is in the camera's field of view. In other words, the plate 52 is placed so each of the dots 53 and 54 is projected onto an image plane 55 within the camera 40, that is, the plane in the camera (behind the lens 42) onto which the captured image is projected. In practice, the dots 53 and 54 are photolithographically formed on the plate 52 of FIG. 4 so as to be 250 microns in diameter and are spaced apart so that the distance between their respective centroids d1 and d2 is 1250 microns.

Figure 4:
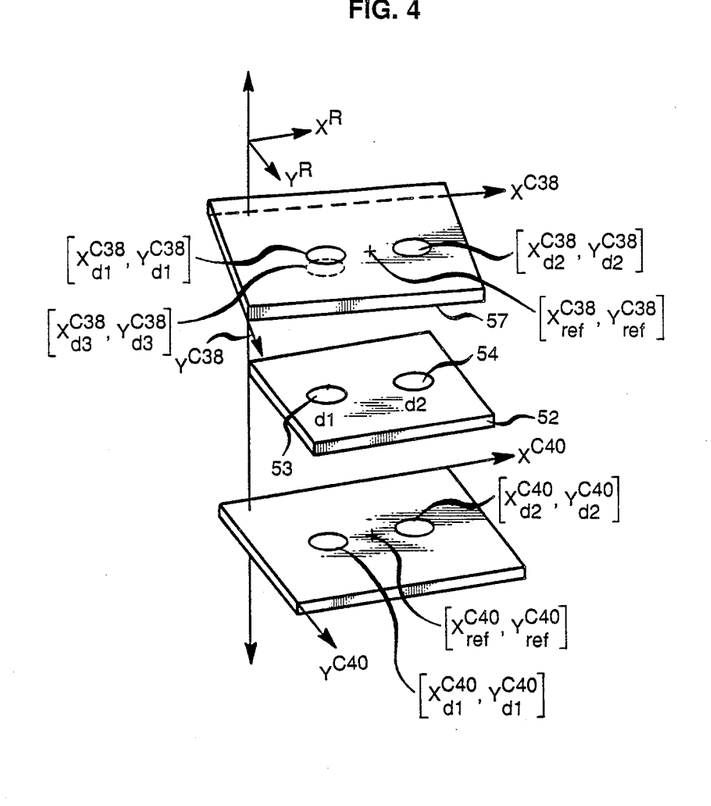
FIG. 4 is a perspective view of a calibration plate interposed between each of a pair of image planes, each associated with a separate one of a pair of cameras of the system of FIG. 2.

After step 51, step 56 of FIG. 3 is executed, at which time, the robotic arm 18 of FIG. 2 is displaced along its x, y and z axes to position the camera 38 of FIG. 2 so that its focal plane is coplanar with the tacking plane and both of the dots 53 and 54 of FIG. 4 are in its field of view. At the completion of step 56, the position of the robotic arm 18, which is given by the coordinates $[X_0^R, Y_0^R]$, is saved. For ease of discussion, the coordinates of a point within the frame of reference of the robotic arm 18 will be referenced by the superscript "R" while the coordinates in the reference frame of each of the cameras 38 and 40 of FIG. 2 will be referenced by the superscripts "C38" and "C40," respectively. The coordinates of attributes on the chip 16 and on the substrate 11 will be referenced by the superscripts "C" and "S," respectively.

Following step 56, step 57 of FIG. 3 is executed and the vacuum pickup tool 22 of FIG. 2 is adjusted so that when the tool engages one of the chips 16 stored in the waffle holder 24 of FIG. 2, the tips of the solder bumps 14 (see FIG. 1) on the chip lie in the tacking plane. Next, step 58 is executed, whereupon the dots 53 and 54 (see FIG. 4), and more particularly, their centroids d1 and d2, respectively, are located within an image plane 57 (see FIG. 4) in the camera 38 of FIG. 2 (i.e., the plane inside the camera on which the captured image is projected). To locate the dot centroids d1 and d2, the camera 38 captures the image of the plate 52 of FIG. 4 and then the vision system 46 of FIG. 2 is processed by the captured image to locate each of the dot centroids, that is, to establish their Cartesian coordinates. The process of capturing the image of the plate 52 and then processing the captured image to locate the dot centroids d1 and d2 is repeated (typically ten times) and the coordinates of the dot centroids are averaged, thereby reducing the effects of noise. The averages of the coordinates of the dot centroids d1 and d2 within the image plane 57 are given by $[X_{d1}^{C38}, Y_{d1}^{C38}]$ and $[X_{d2}^{C38}, Y_{d2}^{C38}]$, respectively, and are stored by the vision system 46 of FIG. 2.

Once the dot centroid coordinate average are established, then step 59 of FIG. 3 is executed, whereupon the robotic arm 18 of FIG. 2 is displaced a set distance (typically 1250 microns) along its x axis so that only the dot 54 of FIG. 4 is in the field of view of the camera 38 of FIG. 2. Next, step 60 of FIG. 3 is executed and the dot 54, and more particularly, its centroid d2, is located in the same manner as previously described with respect to step 58. In other words, the image of the dot 54 is successively captured and processed to obtain an average of the dot centroid coordinates which is given by $[X_{d1}^{C38}, Y_{d3}^{C38}]$.

Following step 60, then step 61 is executed during which the vision system 46 of FIG. 2 computes several parameters required to precisely locate a reference point (hereinafter referred to as a "reference pixel") on the image plane 57 of FIG. 4 of the camera 38 relative to the frame of reference of the robotic arm 18. In actuality, the reference pixel is smaller than each of the picture elements (pixels) in the image captured by the camera 38. The first parameter, a scale factor ($S^{C38}$), represents the ratio of a distance measured in the field of view of the camera 38 to the corresponding distance in the frame of reference of the robotic arm 18, is established. The scale factor $S^{C38}$ is given by the ratio of the measured distance between the dot centroids d1 and d2 in the field of view of the camera 38 to the actual distance between them (1250 microns) and may be expressed mathematically by:

$$S^{C38} = \frac{1}{1250} \sqrt{(X_{d2}^{C38} - X_{d1}^{C38})^2 + (Y_{d2}^{C38} - Y_{d1}^{C38})^2} \quad (1)$$

Also during step 61, the coordinates of the reference pixel in the image plane 57 (see FIG. 4) of the camera 38 are established. Once the coordinates of the reference pixel are established, then the image of an attribute projected onto the image plane 57 can be precisely located by virtue of its distance from the reference pixel. In the illustrated embodiment, the reference pixel in the image plane 57 of the camera 38 of FIG. 2 is located at the midpoint between the dot centroids d1 and d2. The coordinates of the reference pixel $[X_{ref}^{C38}, Y_{ref}^{C38}]$ will be given by the relationship:

$$\begin{bmatrix} X_{ref}^{C38} \\ Y_{ref}^{C38} \end{bmatrix} = \frac{1}{2} \left( \begin{bmatrix} X_{d1}^{C38} \\ Y_{d1}^{C38} \end{bmatrix} + \begin{bmatrix} X_{d2}^{C38} \\ Y_{d2}^{C38} \end{bmatrix} \right) \quad (2)$$

Figure 5:
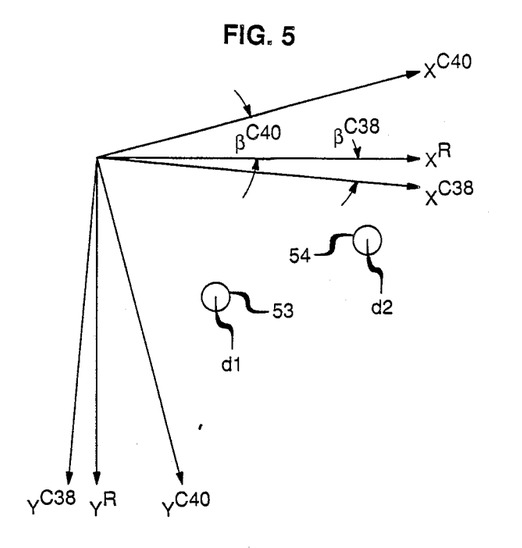
FIG. 5 is a plan view of the image planes and the plate of FIG. 4 superimposed on each other.

Simply knowing the scale factor $S^{C38}$ and the coordinates $[X_{ref}^{C38}, Y_{ref}^{C38}]$ of the reference pixel of the camera 38 of FIG. 2 does not provide sufficient information to enable an object appearing in the field of view of the camera to be precisely located in the frame of reference of the robotic arm 18 of FIG. 2. The reason is that the image plane 57 of the camera 38, and hence, the frame of reference of the camera itself, may be rotated relative to the frame of reference of the robotic arm 18. Referring to FIG. 5, which is a plan view of the image plane 57, the plate 52, and the image plane 55 superimposed on each other, the angular rotation of the image plane of the camera 38 relative to the robotic arm 18 is defined by the angle $\beta^{C38}$ which is given by the relationship:

$$\beta^{C38} = \tan^{-1} \left[ \frac{Y_{d1}^{C38} - Y_{d3}^{C38}}{X_{d1}^{C38} - X_{d3}^{C38}} \right] \quad (3)$$

Figure 6A:
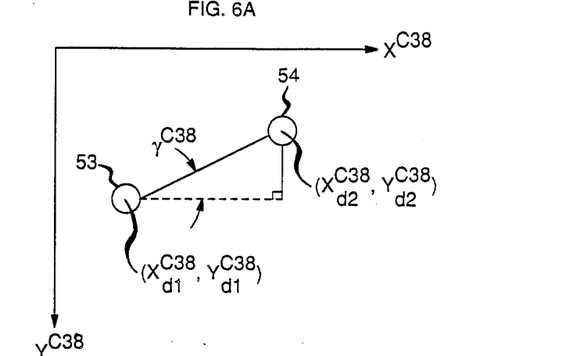
FIGS. 6A and 6B are plan views of a separate one of the image planes of FIG. 4.

Account must also be taken of the possibility that the calibration plate 52 may itself be rotated to the frame of reference of the camera 38. As seen in FIG. 6A, which is a plan view of the image plane 57 of FIG. 4, the angular rotation of the calibration plate 52 of FIG. 4 is given by the angle $\gamma^{C38}$ which is the angle between a line projected through the dot centroids d1 and d2 and the x axis of the camera 38 frame of reference. The angle $\gamma^{C38}$ can be computed from the following relationship:

$$\gamma^{C38} = \tan^{-1} \left[ \frac{Y_{d2}^{C38} - Y_{d1}^{C38}}{X_{d2}^{C38} - X_{d1}^{C38}} \right] \quad (4)$$

Referring to FIG. 3, after step 61, then step 62 is executed, at which time, the dots 53 and 54, and particularly, their centroids d1 and d2, respectively, are located within the image plane 55 of the camera 40 (see FIG. 3). The process by which the dot centroids d1 and d2 are located in the image plane 63 is identical to the process performed during step 58. The image of the plate 52 is repeatedly captured by the camera 40, and then the vision system 46 processes each successive image to obtain the coordinates of the dot centroids d1 and d2 which are then averaged. The averages of the coordinates of the dot centroids d1 and d2 in the image plane 63 of the camera 40 are given by $[X_{d1}^{C40}, Y_{d1}^{C40}]$ and $[X_{d2}^{C40}, Y_{d2}^{C40}]$.

Figure 6B:
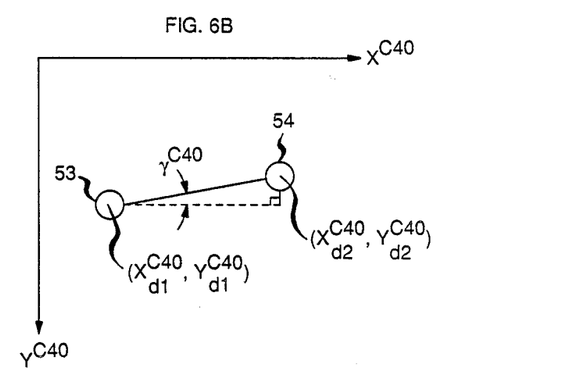

Once step 62 is completed, step 64 is then executed, whereupon the vision system 46 computes the following parameters for the camera 40: a scale factor $S^{C40}$, the coordinates of a reference pixel in the image plane 55, an angle $\beta^{C40}$, and an angle $\gamma^{C40}$. The scale factor $S^{C40}$ and the coordinates $[X_{ref}^{C40}, Y_{ref}^{C40}]$ of tthe reference pixel of the camera 40 can be established from equations (1) and (2), respectively, by substituting the dot centroid coordinates $[X_{d1}^{C40}, Y_{d1}^{C40}]$ and $[X_{d2}^{C40}, Y_{d2}^{C40}]$ for the coordinates $[X_{d1}^{C38}, Y_{d1}^{C38}]$ and $[X_{d2}^{C38}, Y_{d2}^{C38}]$, respectively. Referring to FIG. 6B, which is a plan view of the image plane 55, the angle $\gamma^{C40}$, which represents the angle between a line projected through the dot centroids d1 and d2 and the x axis of the camera 40, can be computed from equation (4) by substituting the dot centroid coordinates $[X_{d1}^{C40}, Y_{d1}^{C40}]$ and $[X_{d2}^{C40}, Y_{d2}^{C40}]$ for the coordinates $[X_{d1}^{C38}, Y_{d1}^{C38}]$ and $[X_{d2}^{C38}, Y_{d2}^{C38}]$, respectively. Referring to FIG. 5, the angle $\beta^{C40}$, which represents the angular offset of the camera 40 from the frame of reference of the robotic arm 18 of FIG. 1, can be computed from the following relationship.

$$\beta^{C40} = (\gamma^{C40} - \gamma^{C38}) + \beta^{C38} \quad (5)$$

Following step 63, the calibration process ends (step 65).

Figure 7:
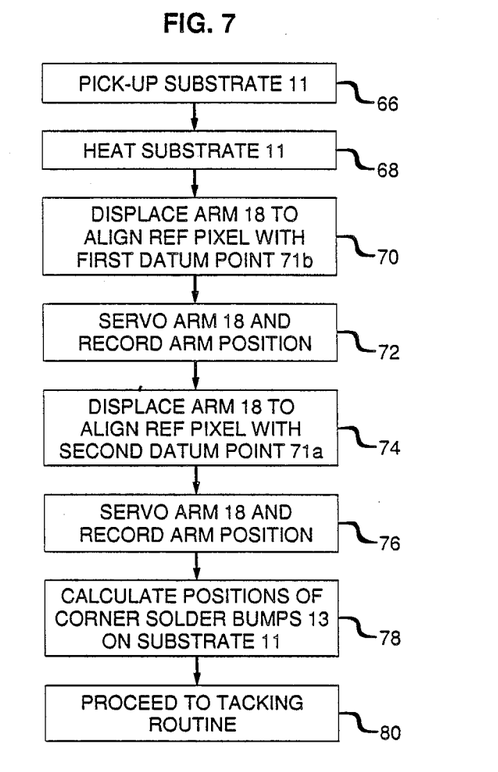
FIG. 7 is a flow chart representation of a process executed by the system of FIG. 2 to precisely locate the substrate of FIG. 1.

After completing the calibration process, then the process of placing each chip 16 on the substrate 11 and then tacking the chip to the substrates is begun. However, before a chip 16 can be placed on, and then tacked to, the substrate 11, the substrate first must be "located," that is, its position in the frame of reference of the robotic arm 18 must be accurately established. The process by which each substrate 11 is located in the frame of reference of the robotic arm 18 is shown in flow chart form in FIG. 7. Referring to FIG. 7, the first step (step 66) in the locating process is to pick up the substrate 11 from the waffle holder 28 with the vacuum pickup tool 22 and thereafter place the substrate in the substrate chuck 32, all of FIG. 2. Next, the substrate 11 is heated (step 68) in the chuck 32 by means of its internal heater. As the substrate 11 is being heated, its temperature is monitored by the temperature controller 31 (see FIG. 2). In a preferred embodiment, the substrate 11 is heated to an equilibrium temperature of approximately 240° C.

After the substrate 11 has been heated to its equilibrium temperature, the robotic arm 18 is then displaced during step 70 of FIG. 3 to align the reference pixel of the camera 38 with a first one of a pair of datum points 71a and 71b (see FIG. 8) located at the lower right and lower left of the substrate 11. (Typically, the left-hand datum point 71b is located first although the right-hand datum point 71 could just as easily be found first.) In practice, unsymmetrical illumination of each of the datum points 71a and 71b, when not in close proximity to the reference pixel of the camera 38, as well as a non-linear field of view by the camera due to its optics and inaccurate scale factors, often prevents the robotic arm 18 from being displaced in a single movement to exactly align the reference pixel of the camera 38 with each datum point. Yet, unless the reference pixel associated with the camera 38 is indeed precisely aligned with each of the datum points 71a and 71b, it is typically not possible to precisely locate the solder bumps 13 on the substrate 11, making it impossible to precisely align them with the corresponding solder bumps 14 on a chip 16.

To overcome this problem the robotic arm 18 is "servoed" during step 72, that is, the arm is displaced, in accordance with feedback information from the vision system 46 of FIG. 1, to achieve precise alignment of the reference pixel of the camera 38 with the datum point 71b. The servoing of the robotic arm 18 is an iterative process, that is, the robot arm is moved, and then the error, if any, between the location of the reference pixel of the camera 38 and that of the datum point 71b is computed. The vision system 46 of FIG. 1 then generates an error signal, in accordance with the computed error, and supplies the signal to the robotic arm controller 19 of FIG. 1 which displaces the robotic arm 18 accordingly. The resulting position error between the reference pixel of the camera 38 and the datum point 71b is then re-computed and the robotic arm 18 is moved in accordance with the error.

Figure 8:
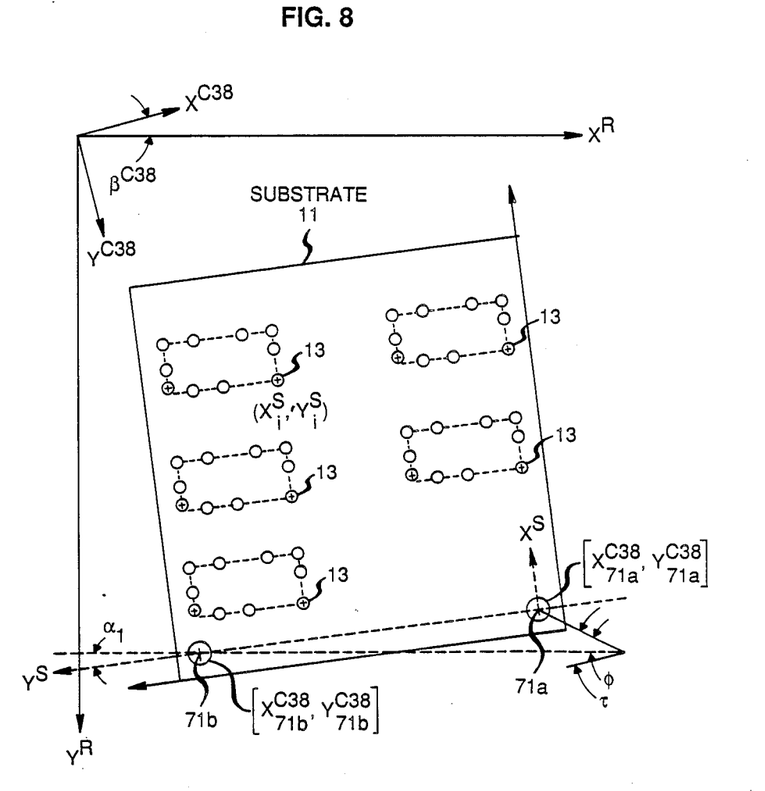
FIG. 8 is a plan view of the substrate of FIG. 1.

To better understand how the robotic arm 18 is servoed, during step 72, reference should be had to FIG. 8. Assume that the robotic arm 18 is displaced during step 70 to align the reference pixel of the camera 38 with the datum point 71b, but, because of errors due, for example, to mechanical registration, tolerances in the waffle pack 24, and tolerances in the size of the chips 16, the coordinates of the reference pixel $[X_{ref}^{C38}, Y_{ref}^{C38}]$ do not correspond to the coordinates $[X_{71b}^{C38}, Y_{71b}^{C38}]$ of the datum point. The first step in calculating the position error is to define a pair of angles $\tau$ and $\phi$. The angle $\tau$ represents the angle between the x axis of the camera 38 and a line running between the reference pixel of the camera and the datum point 71b. The value of $\tau$ can be established from the following relationship:

$$\tau = \tan^{-1}\left[\frac{Y_{ref}^{C38} - Y_{71b}^{C38}}{X_{ref}^{C38} - X_{71b}^{C38}}\right] \quad (6)$$

The angle $\phi$ represents the angle between the x axis of the robotic arm 18 and the line running between the reference pixel and the datum point 71b. The value of $\phi$ may be established from the relationship:

$$\phi = \tau - \beta^{C38} \quad (7)$$

Once $\tau$ and $\phi$ have been established, then the length t of the line running between the reference pixel of the camera and the datum point 71b is computed. The length t is given by:

$$t = \frac{1}{S^{C38}} \sqrt{(X_{ref}^{C38} - X_{71b}^{C38})^2 + (Y_{ref}^{C38} - Y_{71b}^{C38})^2} \quad (8)$$

The necessary distance of movement of the robotic arm 18 in the x direction and y direction, as represented by the terms $X_\Delta^R, Y_\Delta^R$, is established by the vision processor 46 from the relationship:

$$\begin{bmatrix} X_\Delta^R \\ Y_\Delta^R \end{bmatrix} = \tau \begin{bmatrix} \cos \phi \\ \sin \phi \end{bmatrix} \quad (9)$$

The robotic arm 18 is then displaced this distance to align the reference pixel of the camera 38 with the datum point 71b.

After the robotic arm 18 has been moved, the position error between the reference pixel of the camera 38 and the datum point 71b is again computed, and the robotic arm is again moved in accordance with the distance established from eq. (9). This process is repeated, typically three times, until the robotic arm 18 has been displaced so that the reference pixel of the camera 38 is aligned with the datum point 71b within 5 microns, an error tolerance of typically one half of the robot arm's resolution of 10 microns. Once the robotic arm 18 has been displaced to align the reference pixel of the camera 38 with the datum point 71b, the coordinates of the robotic arm $[X_{71b}^R, Y_{71b}^R]$ are saved.

In practice, the robot arm 18 does not have infinite resolution and would, in fact, oscillate if an attempt were made to achieve exact registration of the camera 38 reference pixel with the datum points 71a and 71b. To avoid this problem, once the robot arm 18 has been servoed such that the error is equal to or less than ½ the arm's resolution (5 microns), the error is then subtracted from the final position of the arm. This error, often referred to as the unattainable distance of movement, will be reflected in the coordinates $[X_{71b}^R, Y_{71b}^R]$ $[X_{71a}^R, Y_{71a}^R]$ of the datum points 71a and 71b in the frame of reference of the robot arm 18.

Referring to FIG. 6, following step 72, step 74 is executed, at which time the robotic arm 18 is displaced to locate the reference pixel of the camera 38 in alignment with the datum point 71a. As discussed earlier, exact alignment of the reference pixel of the camera 38 with each of the datum points 71a and 71b usually cannot be accomplished by a single movement of the robotic arm 18. Therefore, following step 74, step 76 is executed and the robotic arm 18 is servoed, in exactly the same manner as described previously during step 72, to precisely align the reference pixel of the camera 38 with the datum point 71a. After the reference pixel of the camera 38 has been aligned with the datum point 71a (within the predetermined tolerance), the position $[X_{71a}^R, Y_{71a}^R]$ of the robotic arm is saved. Just as the coordinates $[X_{71b}, Y_{71b}]$ reflect the unattainable distance of movement of the robot arm 18, so too do the coordinates $[X_{71a}, Y_{71a}]$.

After step 76, step 78 is executed and the coordinates of a reference solder bump 13 in each pattern of bumps (corresponding to a placement site for a chip 16) are calculated. Referring to FIG. 8, in practice, the reference solder bump 13 in each placement site is chosen to correspond to the corner solder bump closest to the datum point 71a. From the design of the substrate 11, the location of every corner solder bump 13 (relative to the frame of reference of the substrate) is known. Thus, the corner solder bump 13 in the $i^{th}$ placement site (where i is an integer) will be located at the coordinates $[X_{13i}^S, Y_{13i}^S]$. However, in order for the robotic arm 18 to accurately place each individual chip 16 on the substrate 11, the reference corner solder bump 13 in each placement site must be located in the frame of reference of the robotic arm 18. To convert the coordinates $[X_{13i}^S, Y_{13i}^S]$ of each reference corner solder bump 13 to the corresponding coordinates in the reference frame of the robotic arm 18, it is first necessary to account for the fact that the substrate 11 may be rotated. Referring to FIG. 8, the angular rotation of the substrate 11, relative to the x axis of the frame of reference of the robotic arm 18, is given by an angle $\alpha_1$ which may be established from the relationship:

$$\alpha_1 = \tan^{-1}\left[\frac{Y_{71b}^R - Y_{71a}^R}{X_{71b}^R - X_{71a}^R}\right] \quad (10)$$

From a knowledge of the angle $\alpha_1$, the coordinates $[X_{13i}^S, Y_{13i}^S]$ of the corner solder bump 13 in the $i^{th}$ placement site can be translated into the frame of reference of the robotic arm 18 using the relationship:

$$\begin{bmatrix} X_{13i}^R \\ Y_{13i}^R \end{bmatrix} = \begin{bmatrix} X_{71a}^R \\ Y_{71a}^R \end{bmatrix} + \begin{bmatrix} t_{11} & t_{12} \\ t_{21} & t_{22} \end{bmatrix} \begin{bmatrix} X_{13i}^S \\ Y_{13i}^S \end{bmatrix} \quad (11)$$

where $t_{11}, t_{12}, t_{21},$ and $t_{22}$ are each trigonometric functions of the angle $\alpha_1$.

The solder bumps 13 on the substrate 11 are normally arranged so that each of the horizontal rows of bumps in each placement site is aligned with the axis of the substrate. In other words, a line (not shown) projected through the centroid of two adjacent bumps 13 will be parallel to one of the substrate's axes. However, if a particular pattern of solder bumps 13 is in fact skewed (i.e., the line through the bump centroids is not parallel to an axis of the substrate 11), then the degree to which the reference corner bump in the pattern is angularly offset from the x axes of the substrate 11 must be accounted for. Thus, associated with the coordinates $[X_{13i}^S, Y_{13i}^S]$ of each reference corner solder bump 13 is an angle $S_i^S$ (not shown) which designates the angular offset, if any, between the solder bump and the x axes of the substrate 11. This angular offset ($S_i^S$) is compensated for by subtracting it from the required angle of rotation necessary to match the chip 16 to the substrate 11.

Figure 9:
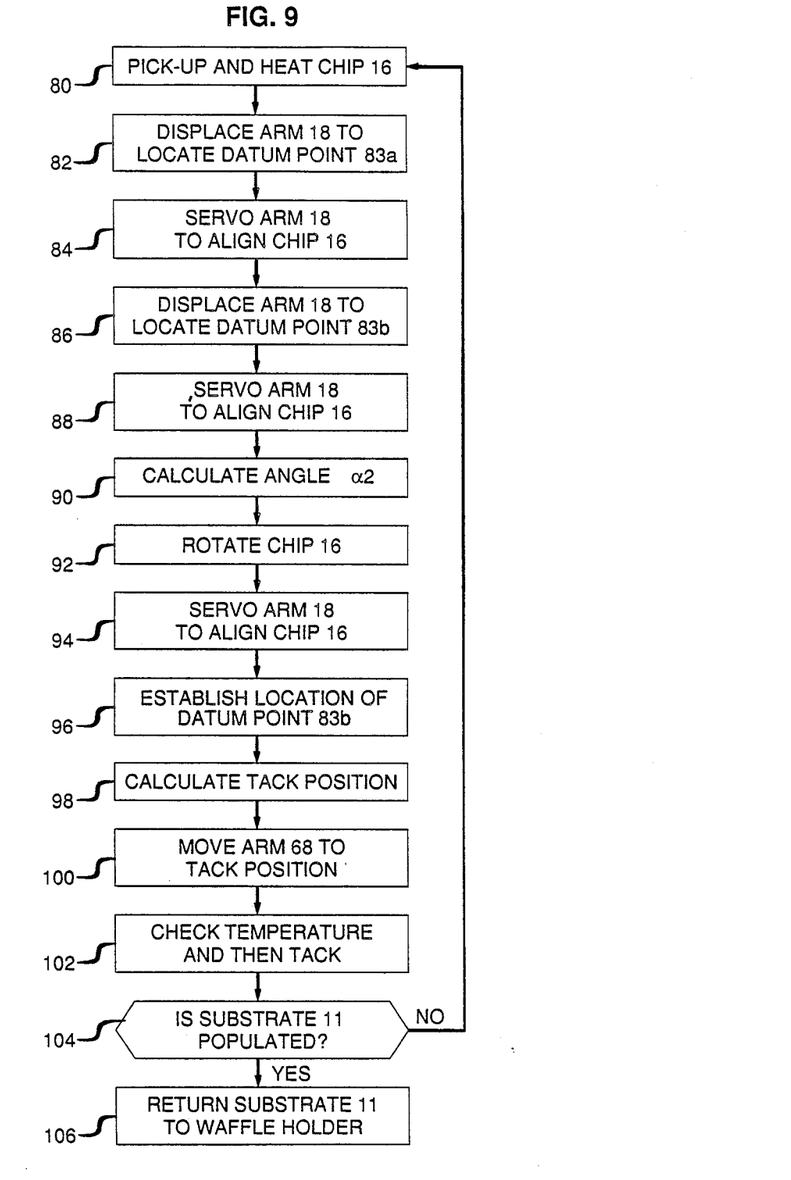
FIG. 9 is a flow chart representation of a process executed by the system of FIG. 2 to tack each chip of FIG. 1 to the substrate of FIG. 1.
Figure 10:
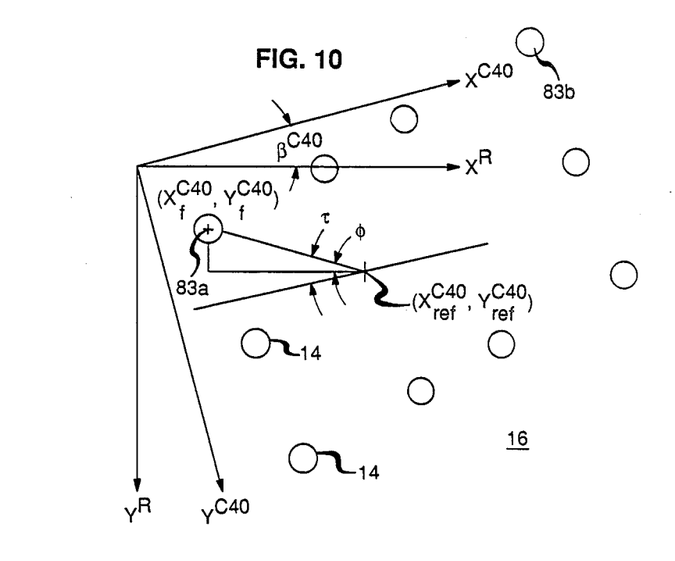
FIG. 10 is a plan view of the undersurface of the chip of FIG. 1.

Referring to FIG. 7, after step 78, step 80 is executed, and program execution branches to the tacking routine which is shown in flow chart form in FIG. 9. Referring to FIG. 9, the first step (step 80) in the tacking routine is to displace the robotic arm 18 to position the vacuum pickup tool 22 over the waffle holder 24 so that the tool can pick up one of the chips 16, all of FIG. 2. Once the chip 16 is picked up, the heater (not shown) within the vacuum pickup tool 22 heats the chip to an equilibrium temperature of 240° C. under the control of the temperature controller 31. Once the chip 16 has been heated to the appropriate temperature, step 82 is executed and the robotic arm 18 is displaced to align a first one of a pair of datum points 83a and 83b (see FIG. 6) on the undersurface of the chip 16 with the reference pixel of the camera 40. Each of the datum points 83a and 83b corresponds to the centroid of a separate one of a pair of corner solder bumps 14 on the undersurface of the chip 16.

Exact alignment of the datum point 83a with the reference pixel of the camera 40 is usually not possible during step 82 for the same reason that the reference pixel of the camera 38 cannot initially be aligned with each of the datum points 71a and 71b on the substrate 11. Therefore, following step 82, step 84 is executed and the robotic arm 18 is servoed, in exactly the same way as described with respect to steps 72 and 76 of FIG. 6, to accurately align the datum point 83a on the chip 16 with the reference pixel of the camera 40. When the datum point 83a is aligned (within the predetermined error tolerance) with the reference pixel of the camera 40, the position of the robotic arm $[X_{83a}^R, Y_{83a}^R]$ is recorded. As with the substrate 11, the coordinates $[X_{83a}^R, Y_{83a}^R]$ of the datum point 83a on the chip 16 also reflect the unattainable distance of movement of the robotic arm 18.

Once the robotic arm 18 has been servoed during step 84, then the robotic arm is displaced during step 86 to nominally locate the second datum point 83b in alignment with the reference pixel of the camera 40. The robotic arm 18 is then servoed during step 88 to exactly align the second datum point 83b with the reference pixel of the camera 40. When the datum point 83b has been aligned with the reference pixel of the camera 40 (within the predetermined tolerance), the position $[X_{83b}^R, Y_{83B}^R]$ of the robotic arm 18 is saved. Like the coordinates $[X_{83a}^R, Y_{83a}^R]$, the coordinates $[X_{83b}^R, Y_{83b}^R]$ reflect the unattainable distance of movement of the robotic arm 18.

Next, an angle $\alpha_2$, representing the angular offset of the chip 16 from the frame of reference of the robotic arm 18, is computed during step 90. The value of $\alpha_2$ can be obtained from equation (10) by substituting the coordinates $[X_{83a}^R, Y_{83a}^R]$ and $[X_{83b}^R, Y_{83b}^R]$ for the coordinates $[X_{71a}^R, Y_{71a}^R]$ and $[X_{71b}^R, Y_{71b}^R]$, respectively. After the angle $\alpha_2$ is computed during step 90, then the vacuum pickup tool 22 is rotated during step 92 to rotate the chip 16 through an arc equal to $\alpha_2 - \alpha_1$ so that the chip is now angularly oriented the same as the substrate 11. If, as discussed previously, a pattern of bumps 13 on the substrate 11 is itself offset by an angle $S_f^S$, then the arc of rotation necessary to align the chip 16 will be equal to $\alpha_2 - \alpha_1 - S_f^S$.

Once the chip 16 has been rotated, the datum point 83b on the undersurface of the chip 16 is no longer in registration with the reference pixel of the camera 40. Therefore, following step 92, step 94 is executed and robotic arm 18 is servoed in the manner described previously to realign the datum point 83b with the reference pixel of the camera 40. Next, step 96 is executed and the location of the corner solder bump 14 on the undersurface of the chip 16, to be placed on the previously located reference solder bump 13, is itself established in the frame of reference of the robotic arm 18. The coordinates will be given by $[X_{83b}^R, Y_{83b}^R]$ obtained previously.

Following step 96, step 98 is executed and the coordinates of the robotic arm 18 required to place the chip 16 in the "tack" position are established. At the tack position, the previously located corner solder bump 14 on the chip 16 is aligned with the corresponding reference corner solder bump 13 on the substrate 11 in the substrate chuck 32, thus assuring that the remaining bumps on the chip are aligned with those on the substrate. The final coordinates $[X_f^R, Y_f^R]$ of the robotic arm 18 required to place the chip 16 in the tack position are given by:

$$\begin{bmatrix} X_f^R \\ Y_f^R \end{bmatrix} = \begin{bmatrix} X_{83b}^R \\ Y_{83b}^R \end{bmatrix} + \begin{bmatrix} X_{13i}^R \\ Y_{13i}^R \end{bmatrix} - \begin{bmatrix} Y_0^R \\ Y_0^R \end{bmatrix} \quad (12)$$

Once the tack position is established, the temperature of the chip 16 and the substrate 11 are checked (step 100), and if both are sufficiently hot, the chip is then tacked to the substrate seated in the substrate chuck 32 by thermocompression. Following step 102, a check is made during step 104 to determine if the substrate 11 has been fully populated with the chips 16. If the substrate 11 has not been fully populated, then steps 80-102 are re-executed. Otherwise, step 106 is executed, whereupon the now fully populated substrate 11 is returned to the waffle holder 28.

After populating the substrate 11, the next unpopulated substrate in the waffle holder is located and placed in the substrate chuck 32 in the manner described previously with respect to FIG. 6. Then, the chips 16 are tacked to the substrate 11 as described with respect to FIG. 9. The processes of locating and placing each substrate 11 in the chuck 32, and then tacking the chips 16 to the substrate, are repeated until all the substrates, in the waffle holder 28 have been populated with chips.

While the processes of locating the substrates 11 and 16 tacking the chips 16 are performed repeatedly, the calibration routine described with respect to FIG. 3 is usually performed only once, at the outset of operation. Typically, an operator will initiate the calibration routine at the outset of a manufacturing shift, and thereafter, the system 10 will operate unattended to automatically populate a batch of the substrates 11 with the chips 16.

The foregoing describes a technique for accurately placing a chip 16 on a substrate 11 such that the solder bumps 14 on the chip are each in substantially exact registration with the corresponding solder bumps 13 on the substrate. Exact placement of the chip 16 on the substrate 11 is obtained by the use of two television cameras 38 and 40 which capture the image of the substrate and the chip, respectively. The cameras 38 and 40 are calibrated such that a reference pixel within the field of view of each is located. Once a reference pixel in each of the cameras 38 and 40 has been located, then the image captured by each camera can be used to ascertain the exact location of the substrate and chip, respectively, thereby allowing precise placement.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method of fabricating an object with an article placed thereon using a system comprised of a movable gripping device and a pair of cameras, the first camera mounted to the gripping device for movement therewith, and the second camera being stationary, the method comprising the steps of:

calibrating the system to establish the location and orientation, relative to the gripper, of a reference pixel in the field of view of each of the first and second cameras;

displacing the gripper to successively locate the reference pixel in the field of view of the first camera in substantially exact registration with each of a pair of datum points on the object to establish the location of the object;

engaging the article with the gripper;

displacing the gripper to successively locate the article in the field of view of the second camera so that each of a pair of datum points on the article is in substantially exact registration with a reference pixel in the second camera's field of view to establish the location of the article; and displacing the gripper to precisely place the article on the object such that each of the datum points on the article is in a prescribed relationship with a separate one of the datum points on the object.

2. The method according to claim 1 wherein the step of calibrating the system comprises the steps of:

positioning the first camera in a predefined orientation relative to the second camera;

placing a calibration plate, having at least a pair of precisely spaced features thereon, between the cameras so that the features on the plate appear within the field of view of each camera;

establishing the position of the reference pixel in each camera in accordance the position of the features on the plate;

moving the first camera by a fixed distance along a known path; and establishing the degree to which the field of view of each camera is rotated in accordance with the shift in position of the features on the plate when the first camera is moved.

3. The method according to claim 2 wherein the position of the reference pixel of each camera is established so as to lie at the midpoint between the features on the calibration plate.

4. The method according to claim 1 where the step of displacing the gripper to locate the reference pixel of the first camera in substantially exact registration with each of the datum points on the object comprises the steps of:

displacing the gripper to locate the reference pixel of the first camera in nominal alignment with the datum point on the object;

processing the image of the first camera to establish the error in position between the reference pixel of the first camera and the datum point on the object;

moving the gripper in accordance with the position error to null the position error between the reference pixel of the first camera and the datum point on the object; and repeating the steps of processing the image of the first camera, and moving the gripper to null the position error, until the position error between the reference pixel of the first camera and the datum point on the object is within a predetermined tolerance factor.

5. A method of precisely placing a chip on a substrate with the aid of a gripper and a pair of cameras, the first mounted to the gripper to move therewith and the other camera being stationary, the method comprising the steps of:

(a) calibrating the system to establish the location of a reference pixel in each camera relative to the frame of reference of the gripper;

(b) displacing the gripper to successively locate the reference pixel of the first camera in substantially exact registration with each of a pair of datum points on the substate to establish its location;

(c) engaging the substrate with the gripper;

(d) displacing the gripper to place the substrate in a chuck;

(e) engaging a chip with the gripper;

(f) displacing the gripper to displace the chip so that each of a separate one of a pair of datum points on the chip is successively placed in substantially exact registration with a reference pixel in the second camera's field of view to establish the location of the chip;

(g) displacing the gripper to place the chip on the substrate such that each datum point on the chip is in a prescribed relationship with a separate one of the datum points on the substrate; and (h) tacking the chip to the substrate.

6. The method according to claim 5 wherein each of the steps (a)-(h) is repeated to tack each of a plurality of chips to the substrate.

7. The method according to claim 5 wherein the step of calibrating the system comprises the steps of:

positioning the first camera in a predefined orientation relative to the second camera;

placing a calibration plate, having at least a pair of precisely spaced features thereon, between the cameras so that the features on the plate appear within the field of view of each camera;

establishing the position of a reference pixel in each camera in accordance with the position of the features on the plate;

moving the first camera by a fixed distance along a known path; and establishing the degree to which the field of view of each camera is rotated in accordance with the shift in position of the features on the plate when the first camera is moved.

8. The method according to claim 7 wherein the position of the reference pixel of each camera is established so as to lie at the midpoint between the features on the calibration plate.

9. The method according to claim 5 where the step of displacing the gripper to locate the reference pixel of the first camera in substantially exact registration with each datum point on the substrate comprises the steps of:

(a) displacing the gripper to locate the reference pixel of the first camera in nominal alignment with each datum point on the substrate;

(b) procesing the image of the first camera to establish the error in position between the reference pixel of the first camera and each datum point on the substrate;

(c) moving the gripper in accordance with the error signal to null the position error between the reference pixel of the first camera and each datum point on the substrate; and (d) repeating steps (b) and (c) until the position error between the reference pixel of the first camera and each datum point on the substrate is within a predetermined tolerance factor.

10. The method according to claim 5 wherein the step of displacing the gripper to locate the datum point on the chip in substantially exact registration with the reference pixel of the second camera comprises the steps of:

(a) displacing the gripper to locate each datum point on the chip in nominal alignment with the reference pixel of the second camera;

(b) processing the image of the second camera to establish the error in position between each datum point on the chip and the reference pixel of the second camera;

(c) moving the gripper in accordance with the error signal to null the position error between each datum point on the chip and the reference pixel of the second camera; and (d) repeating the steps of: (b) processing the image of the second camera, and (c) moving the gripper to null the position error, until the position error between each datum point on the chip and the reference pixel of the second camera is within a predetermined tolerance factor.

11. Apparatus for precisely placing an article on an object comprising:

a movable gripper for engaging an article to place it on an object;

a first television camera carried by the gripper for capturing the image of the object to be picked up by the gripper to locate each of a plurality of datum points on the object relative to a reference pixel within the camera's field of view;

a second camera which is stationary relative to the gripper for capturing the image of the article picked up by the gripper to locate each of a plurality of datum points on the article relative to a reference pixel in the field of view of the second camera;

a vision system coupled to each of the cameras for processing the image captured by each to establish the difference in position between the reference pixel of the first camera and the datum point on the object, and between the reference pixel of the second camera and the datum point on the article; and a control system, responsive to the difference in position established by the vision system, for controlling the robot to place the article on the object such that the datum point on each is in a prescribed relationship relative to the other.

12. The apparatus according to claim 11 wherein the gripper comprises a vacuum tool.

* * * * *